SEMICONDUCTOR CHOPPER AMPLIFIER WITH TWIN EMITTERS

Filed March 29, 1963

INVENTORS:
WINAND J. DAUTZENBERG
WALTER B. MITCHELL
ROBERT L. TRENT
JULIUS E. VAN WAGENEN
RICHARD R. RAU
BY Curtis, Morris & Safford
ATTORNEYS:

INVENTORS:
WINAND J. DAUTZENBERG
WALTER B. MITCHELL
ROBERT L. TRENT
JULIUS E. VAN WAGENEN
RICHARD R. RAU

Curtis, Morris & Safford
ATTORNEYS.

SEMICONDUCTOR CHOPPER AMPLIFIER WITH TWIN EMITTERS

Filed March 29, 1963

INVENTORS:
WINAND J. DAUTZENBERG
WALTER B. MITCHELL
ROBERT L. TRENT
JULIUS E. VAN WAGENEN
RICHARD R. RAU
BY Curtis, Morris & Safford
ATTORNEYS.

SEMICONDUCTOR CHOPPER AMPLIFIER WITH TWIN EMITTERS

Filed March 29, 1963

INVENTORS:
WINAND J. DAUTZENBERG
WALTER B. MITCHELL
ROBERT L. TRENT
JULIUS E. VAN WAGENEN
RICHARD R. RAU
BY
Curtis, Morris & Safford
ATTORNEYS.

United States Patent Office 3,408,542

Patented Oct. 29, 1968

3,408,542

SEMICONDUCTOR CHOPPER AMPLIFIER WITH TWIN EMITTERS

Winand J. Dautzenberg and Walter B. Mitchell, Danbury, Robert L. Trent, Westport, and Julius E. Van Wagenen and Richard R. Rau, Newtown, Conn., assignors to National Semiconductor Corporation, Danbury, Conn.

Filed Mar. 29, 1963, Ser. No. 269,012
11 Claims. (Cl. 317—235)

This invention relates to semiconductive electrical circuit elements and more particularly to junction semiconductor circuit elements utilizable as high-speed switches and to circuits incorporating such elements.

Prior junction semiconductor elements such as transistors have several properties which make their operation relatively unstable. A broad object of this invention is to provide a semiconductive electrical circuit element in which the degree of instability produced by these properties is minimized.

One of the major causes of instability in the output voltage signal produced by presently available transistors is the presence of voltage drops known as "offset voltages" between the terminals of the transistor. It is believed that the main cause of these voltages is the lack of symmetry in the structure of the transistor. In many transistor circuits such offset voltages are added directly to the output signal voltage produced by the transistor and therefore represent error components in that output signal. These error components usually have a magnitude of at least a few hundred micro-volts (millionths of a volt) and are especially undesirable in many modern circuits using transistors to control output signals having roughly the same magnitude as these error components. These error components are even more undesirable since their magnitudes vary substantially with variations in the temperature at which the transistor is operated and with variations in the amount of current flowing in the path taken through the transistor by the output signal current.

One known method of compensating for these offset voltages is to connect two or more transistors together in a manner such that the offset voltages produced by one transistor are opposed or "bucked-out" by those produced by another one of the transistors. One disadvantage of this arrangement is that it requires two separate transistors instead of one and requires additional labor to produce the circuit in which the arrangement is used. More seriously, however, this arrangement does not effectively eliminate all error components caused by these offset voltages because each of these offset voltages varies with the temperature at which each transistor is operated, the age of the transistor, the extent to which it has been used, and with the change in current flowing in the transistor along the path taken by the output signal current.

To minimize the variations in the error component produced in such a compensating arrangement due to temperature and aging variations, it has been common to use only transistors laboriously and carefully selected to have approximately the same age and electrical characteristics as nearly identical to one another as possible. Use of this matching technique is undesirable since it adds a considerable amount of expensive hand labor to the fabrication of circuits using this compensation arrangement. Furthermore, it is practically impossible to match any two transistors exactly and it has been found that the overall error component produced by the matched transistors in such an arrangement still varies by an appreciable amount despite such careful matching. Accordingly, it is still necessary to provide expensive temperature control equipment for use with the matched transistors in order to minimize such fluctuation in the overall error component. Moreover, the offset voltages of each transistor, and, hence, the overall error component, still vary with a change in current flowing through the signal path in the transistor.

Accordingly, it is an object of this invention to provide a junction semiconductor circuit element in which the offset voltages have relatively small magnitudes and are compensated for without the need for auxiliary circuit elements, matching of transistor characteristics, or extremely precise ambient temperature control.

A further object of the present invention is to provide such an element in which the offset voltages are relatively independent of the magnitude of the current flowing in the path taken by the signal current flowing through the element.

Another problem met in the use of transistors generally, and especially in their use to control output signal voltages in the micro-volt range, is that each wiring junction which connects two dissimilar metals together acts as a thermocouple junction. For example, a thermocouple junction may be produced when a gold lead wire is thermo-compression bonded to the metallized contact areas of either the base, the emitter, or the collector of a silicon or germanium transistor. The thermocouple junction voltages appearing in the signal path through the circuit add further error components to the output of the transistor. This adds a further degree of instability since this error component varies in magnitude with ambient temperature changes and changes in current flowing through the thermocouple junctions.

Thus, another disadvantage of the above-described matched transistor compensating arrangement is that it increases the number of thermocouple junctions in the output circuit and therefore increases the number of temperature and current-sensitive error components in the output signal.

Therefore, it is another object of this invention to provide a junction semiconductor circuit element in which the offset voltages are compensated for without any substantial increase in the number of thermocouple junctions appearing in the output circuit of the element.

Another problem met in using the matched transistor compensating arrangement is that as each transistor ages it often experiences small changes in the current-voltage characteristic of its base-collector junction. Since such changes in one transistor seldom are the same as those in the other, these changes often unbalance the matched circuit and may render it inoperative.

Another object of this invention is, therefore, to provide a junction semiconductor circuit element in which offset voltages are compensated for without subjecting the circuit using the element to unbalance due to small changes in individual semiconductor junctions of the element.

It is still another object of this invention to provide such an element which is small in size, relatively simple and inexpensive to manufacture, and which gives reliable performance.

It is still further an object of this invention to provide electrical circuits utilizing the semiconductor element of this invention advantageously; such circuits including, for example, a high-speed switching or "chopping" circuit, a series-operated modulated-carrier-wave amplifier, a shunt-operated modulated-carrier-wave amplifier, a high-frequency series-differential switching or "chopping" circuit, a phase-angle detector, and a modulated radio-frequency signal supply.

The drawings and descriptions that follow describe the invention and indicate some of the ways in which it can be used so as to meet the above-stated objects. In addition, some of the advantages provided by the invention will be pointed out.

Figure 10:
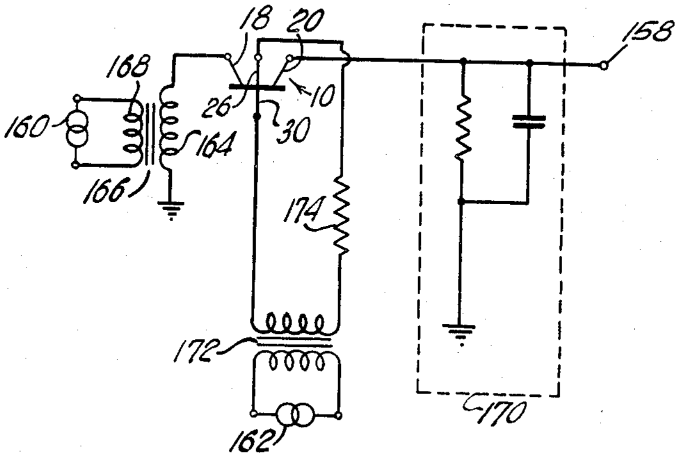
Figure 11:
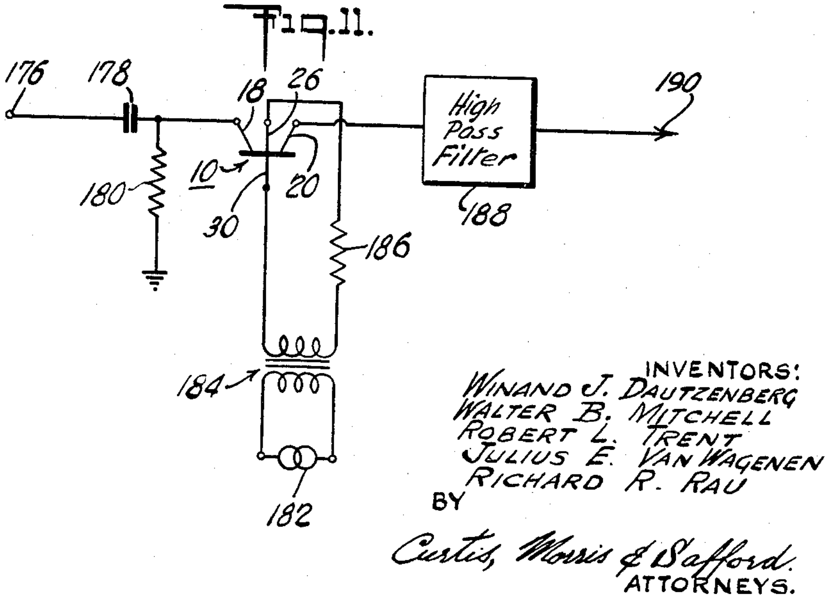

FIGURE 10 is a schematic circuit diagram of an arrangement incorporating a semiconductor element of the present invention for detecting and indicating the magnitude and phase angle of an input signal with respect to a reference signal; and FIGURE 11 is a schematic circuit diagram of modulated-radio-frequency signal supply utilizing a semiconductor element constructed in accordance with the present invention.

Broadly, a semiconductor circuit element constructed in accordance with the present invention comprises a first body or "wafer" of semiconductor material having a first type of conductivity (e.g., a wafer of n-type silicon or germanium), a second body of semiconductor material joined to the wafer and having a second type (e.g. p-type) of conductivity opposite to the first type of conductivity, and third and fourth bodies of semiconductor material each joined to the second body and having the first type (e.g. n-type) of conductivity.

In accordance with the present invention, the first and the second bodies are advantageously used as control electrodes, that is, electrodes through which an electrical control current is conducted. The third and fourth bodies preferably are used as a pair of signal electrodes, i.e. electrodes through which the electrical signal current to be controlled is conducted.

The second, third and fourth bodies preferably are formed in the first body or wafer by suitable diffusion techniques. The third and fourth bodies are positioned close to each other and are substantially identical to each other in dimensions and electrical characteristics. This arrangement not only balances offset voltages appearing at the junctions between the second body and each of the signal electrodes, but also reduces the deviations from a balanced condition due to ambient temperature variations. Further, the control electrodes are so positioned with respect to the signal electrodes that the control current flowing between the control electrodes flows in a direction transverse to the direction of the signal-current flow between the signal electrodes. This feature reduces the variation of current flow in the path in which the output signal current flows and, therefore, reduces the offset voltage variations in the element. Other features and advantages of this arrangement will be discussed in greater detail below.

Figures 1, 1A, 2:
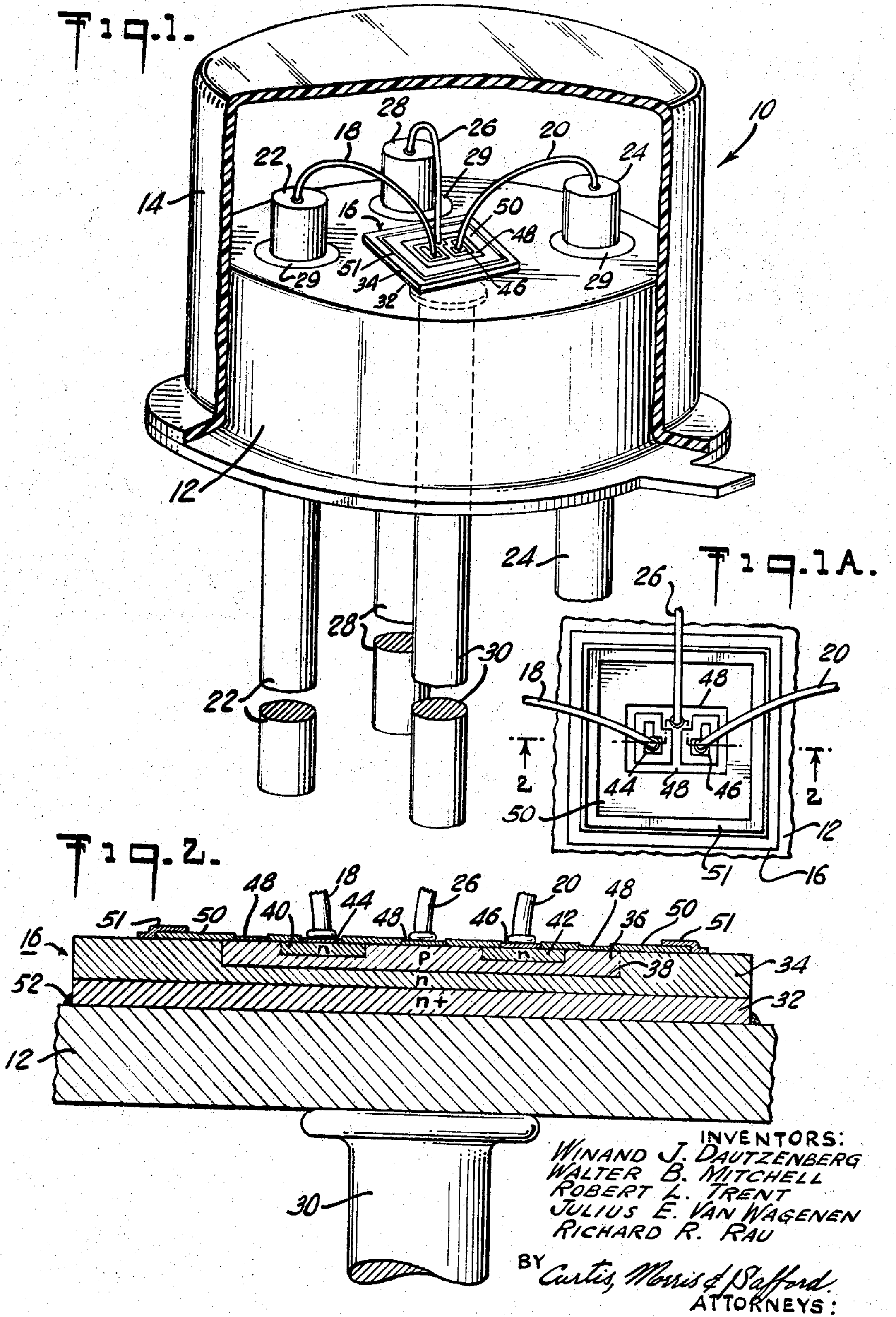
FIGURE 1 is a partially cut-away perspective view of a semiconductor circuit element constructed in accordance with the present invention.
FIGURE 1A is an elevation view of a portion of the semiconductor circuit element shown in FIGURE 1.
FIGURE 2 is a sectional view taken along line 2—2 of FIGURE 1A, in the direction of the arrows.

Referring now to FIGURE 1, a semiconductor circuit element constructed in accordance with the present invention is indicated generally at 10. Element 10 includes a support structure or "header" 12 and a protective casing 14. A wafer 16 of semiconductor material is bonded to the upper surface of header 12. A pair of signal lead wires 18 and 20 are bonded to the signal electrodes of semiconductor wafer 16 and to a pair of external connection pins 22 and 24 which are mounted in the header 12. A control lead wire 26 is bonded to the first or uppermost control electrode of wafer 16 and to a pin 28 which also is mounted in header 12. Electrical insulating material 29 is used to mount pins 22, 24 and 28 in the header 12 and insulate the pins from the header metal. A pin 30 is bonded to the under-side of the upper surface of header 12 and serves as the lead wire to the second or lower control electrode since it is electrically connected to the underside of wafer 16 through the header metal.

It should be understood that the various components of element 10 are drawn to have proportions convenient for purposes of illustration. These proportions are not necessarily the same as in devices actually manufactured in accordance with the present invention. For example, lead wires 18, 20 and 26 typically have a diameter of 1 mil (thousandth of an inch) while the diameter of pins 22, 24, and 28 is 18 mils. In comparison, the wafer 16 is square in shape with sides 25 mils each in length.

Referring now to FIGURE 2, wafer 16 consists of a base layer or substrate 32 of n+ type silicon having a relatively low electrical resistivity (e.g. 0.001 to 0.05 ohm-centimeters) upon which has been deposited a thin layer 34 of n-type silicon having a relatively higher resistivity (e.g., 1 to 5 ohm-centimeters). Layer 34 is formed by deposition from a vapor of appropriately doped silicon material and is deposited so that layer 34 and base layer 32 together form a continuous single-crystal structure. Layer 34 is known as an "epitaxial" layer.

Impurities are diffused into a region 36 in layer 34 to give region 36 p-type conductivity and a relatively high resistivity. The steps used in such a diffusion process are well known in the art and may include oxide coating, washing and etching steps prior to diffusing the impurities. The ohmic contact to region 34 can be used as one control electrode and the ohmic contact to region 36 as the other control electrode; the p-n junction 38 between regions 34 and 36 serves as a control diode junction for the semiconductor element 10.

Two regions 40 and 42 of n-type conductivity material are diffused into region 36. Regions 40 and 42 preferably have a relatively low resistivity. The lateral dimensions of regions 40 and 42 are carefully controlled to make them as nearly identical as possible, and the two regions are spaced as closed to one another as possible. They are diffused simultaneously so that their depths are almost identical. Thus being so nearly alike, regions 40 and 42 have substantially identical electrical characteristics.

Referring now to FIGURE 1A as well as FIGURE 2, L-shaped electrical contacts or electrodes 44 and 46 are formed on the surfaces of regions 40 and 42. An elongated ribbon-like electrical contact 48 is similarly formed on the surface of control region 36. Contact 48 is shaped so as to completely surround signal electrodes 40 and 42. Contacts 44, 46 and 48 all have enlarged portions to which lead wires can be bonded relatively easily. These contacts are formed of a suitable metal such as aluminum or gold by well-known evaporation techniques.

An oxide coating covers the remainder of the surface of wafer 16 and protects the semiconductor junctions of the element 10. A metallic coating 51 is evaporated onto the edges of wafer 16 over the oxide coating 50 to protect the oxide and prevent it from pulling loose from the surface of the wafer.

Wafer 16 is bonded to the upper surface of header 12 by known alloying techniques which form a eutectic bond 52 between the wafer 16 and the header 12.

Lead wires 18, 20 and 26 then are attached by well-known thermal-compression bonding techniques onto contacts 44, 46, and 48, respectively.

Figure 3:
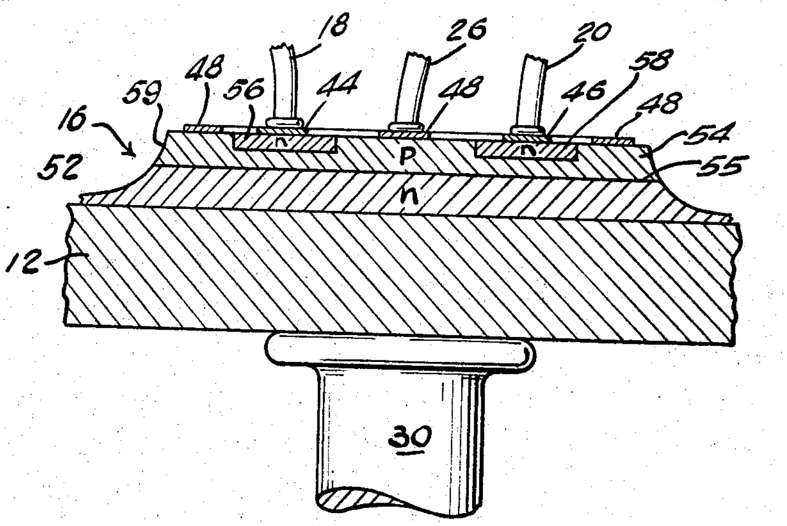
FIGURE 3 is a view, similar to the view in FIGURE 2, of a portion of another embodiment of the present invention.

An alternative "mesa" type of construction for wafer 16 is shown in FIGURE 3. Wafer 16 comprises a thin wafer of n-type silicon having, for example, a resistivity of from 1 to 5 ohm-centimeters. A p-type region 54 is diffused into the upper surface of the wafer. Region 54 serves as a control region for the semiconductor element and forms a control diode junction 55 with the n-type silicon material of the wafer. Diffused into region 54 are signal regions 56 and 58 which have the n-type of conductivity. The dimensions and location of regions 56 and 58 are, like those of regions 40 and 42 of FIGURE 2, carefully controlled to give them substantially identical electrical characteristics. Aluminum electrical contacts 44, 46 and 48 are like the corresponding contacts of FIGURE 2, and are formed, respectively, on emitter regions 56 and 58 and base region 54 in the same manner as described above in relation to the semiconductor element shown in FIGURE 2. Lead wires 18, 20 and 26 are connected, respectively, to contacts 44, 46 and 48 by the methods described above and used in constructing the element shown in FIGURE 2. The edges of the wafer are etched away as indicated at 59 to give a small well-defined control diode junction 55 and to give the wafer its "mesa" shape.

In accordance with the present invention, in using the semiconductor element 10, whether having the construction shown in FIGURE 2 or that shown in FIGURE 3, the electrical signal source whose signal is to be controlled is connected to the two signal electrodes. The electrical source for controlling the input signal is connected between the two control electrodes of the semiconductor element. Thus, when the control signal renders the device conductive, there is a very low impedance between the signal electrodes and signal current flows from one signal electrode to the other through the semiconductor material of the wafer 16 and the control current flows in a direction transverse to the direction of flow of the signal current. For example, in a typical circuit the signal current would flow into the semiconductor element through lead 18 (referring now to FIGURE 2), laterally through regions 32, 34 and 36, and out through lead 20. The control current would flow in through lead 30, vertically through regions 32 and 34, across control diode junction 38, through region 36, and out through lead 26. With this arrangement the direction of the signal-current flow is substantially perpendicular to the direction of control-current flow. Hence, the magnitude of the error voltage generated by the flow of control current in the signal path is minimized. When the control signal renders the device non-conductive, there is a very high impedance between signal regions 40 and 42, and very little signal current flows through the device.

It is believed that the above operation can be explained as follows. Functionally, the element 10 (referring again to FIGURE 2) comprises three semiconductor diode junctions integral in a single wafer of semiconductor material; a control diode being formed at the junction 38 between regions 36 and 34, one signal diode junction being the junction between regions 40 and 36, and another signal diode junction being the junction between regions 42 and 36. The low resistivity "n+" region 32 improves the performance of the control diode, and the low resistivity of signal regions 40 and 42 provide low impedance connections between each of the signal leads 18 and 20 and the interior of the element.

When either there is no control signal applied or when the control signal applied to control leads 26 and 30 has a polarity so as to reverse-bias the control diode, at least one of the signal diode junctions is also reverse-biased and presents a very high impedance to signal terminals 18 and 20. When the element 10 is in this condition, it is said to be "turned-off."

When an electrical signal of polarity such as to forward-bias the control diode is applied to control terminals 26 and 30, electrons are injected from region 34 into region 36. These electrons eventually recombine with holes which flow into region 36 through control terminal 26. However, their concentration in region 36 is such that the semiconductive material of region 36 is rendered conductive so that signal current flows from one signal electrode to the other through region 36. In addition, the resistance to signal current flow through the control diode junction 38 is reduced so that signal current also flows from one signal electrode to the other through control diode junction 38, through regions 32 and 34, and again through junction 38. When the semiconductor element 10 is biased in this manner there is a very low total impedance between the signal terminals, and the element 10 is said to be "turned on."

As mentioned above, in both of the arrangements in FIGURES 2 and 3 both signal regions of semiconductor element 10 are positioned relatively close to one another and are formed simultaneously by diffusion techniques. By so positioning these regions on a single substrate and close to one another, e.g., with a spacing of a few thousandths of an inch between them, the difference between the temperatures of the two signal diode junctions will be minimized. Also, the use of diffusion techniques in forming the signal electrode regions allows them to be given almost exactly the same dimensions. Thus, the electrical characteristics of the two regions are made identical to within better than 5 percent accuracy without the use of expensive and tedious matching of separate transistors or other compensating circuitry.

When compared with the matched transistor compensating arrangements previously mentioned, the semiconductor element 10 has an additional advantage in that its use reduces the number of thermocouple junctions appearing in the signal-current path (as will be described in greater detail below). Also, since element 10 has only one control diode junction, any small changes in the electrical characteristics of this junction will tend to affect both signal electrodes of element 10 similarly and the net effect will be a cancellation of the changes. Thus, semiconductor element 10 is an inherently stable device; that is, its electrical characteristics exhibit very little change over relatively long periods of time and after long use.

The element 10 is especially stable if the passivated oxide-coated type of construction shown in FIGURE 2 is used. Forming metallic control electrode 48 so as to surround the signal electrodes reduces the element's resistance to the flow of signal current when the element is "turned on." Further, this element's epitaxial construction gives it an optimum combination of high-frequency and high-inverse-voltage characteristics.

Other advantages and features of semiconductor elements constructed in accordance with this invention will be pointed out in connection with the discussion accompanying the remaining figures of the drawings.

Figure 4:
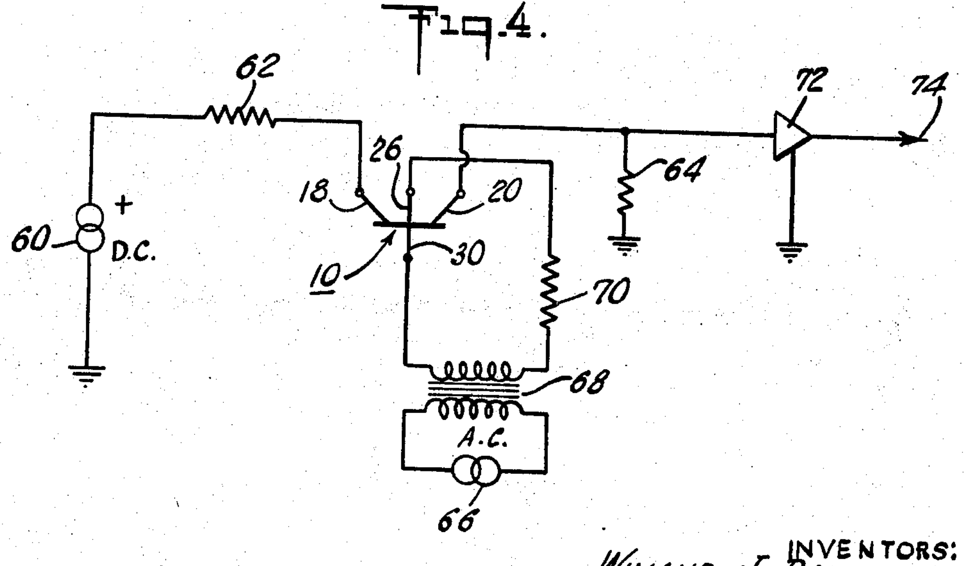
FIGURE 4 is a schematic circuit diagram of a modulated-carrier-wave amplifying circuit constructed in accordance with the present invention.

In FIGURE 4 is shown a modulated carrier wave amplifier utilizing a semiconductor element 10 constructed in accordance with the foregoing description. Signal terminal 18 of semiconductor element 10 is connected to the positive terminal of a direct-current source 60 through the internal resistance 62 of the source. The second signal terminal 20 of element 10 is connected to a load resistor 64 which is connected through ground to the negative terminal of D.C. source 60. A source 66 of alternating current preferably having a square wave form is connected through isolation transformer 68 and a resistor 70 between control terminals 26 and 30 of semiconductor element 10.

The portion of the circuit described so far comprises a switching or "chopping" arrangement. That is, the D.C. signal is conducted through signal terminals 18 and 20 when A.C. source 66 produces a voltage of a polarity such as to turn element 10 on. When the polarity of voltage produced by source 66 reverses, terminals 18 and 20 do not conduct the D.C. signal. The result of this alternate conduction and blocking of the D.C. signal is that the output signal from semiconductor element 10 is "chopped" into segments or modulated.

In the remainder of the FIGURE 4 circuit, terminal 20 also is connected to a grounded amplifier 72 which amplifies the chopped or modulated signal received from terminal 20. The output which appears at terminal 74 of the circuit is, then, an amplified, modulated-carrier-wave.

To best explain the advantages of element 10 when used as a switch or chopper, the devices previously available for performing this function now will be described.

Before the advent of semiconductor circuit elements, the mechanically-operated multivibrator was commonly used a chopper. This device connects and disconnects terminals of a circuit by means of a rapidly vibrating contact arm. Because of the mechanical inertia inherent in the mechanical parts of such a device it has a relatively low speed of operation, e.g., a maximum frequency of around 400 to 1000 cycles per second. In addition, the contacts and moving parts of the multivibrator are subject to wear and fouling, and to mechanical stresses.

Semiconductor devices such as transistors have replaced mechanical multivibrators in many circuits requiring moderately high-frequency switching. The advantage of using transistors rather than multivibrators is considerable, but, as mentioned above, transistors available prior to the present invention suffer from the defects of having relatively high offset voltages which are sensitive to changes in ambient temperature, changes in the current flowing through the signal path, and to aging. To overcome these difficulties, in one compensating arrangement two transistors whose characteristics are matched as described above are connected together to form a chopper circuit.

Figure 5:
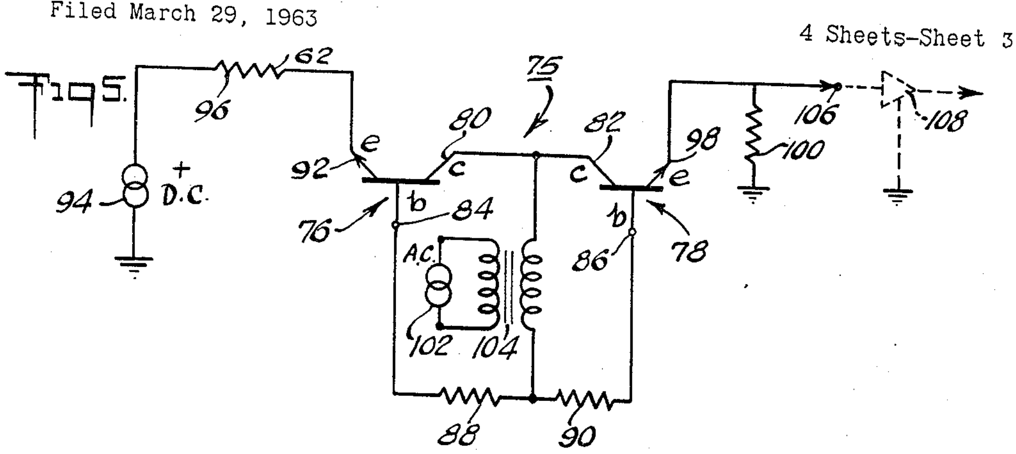
FIGURE 5 is a schematic circuit diagram of a modulated-carrier-wave amplifier employing a matched pair of semiconductor circuit elements in accordance with the prior art.

Referring now to FIGURE 5, a typical matched-pair transistor chopper circuit is indicated generally at 75. In this circuit a pair of transistors 76 and 78 whose electrical characteristics have been painstakingly matched have their collectors 80 and 82 connected to one another and their bases 84 and 86 connected together through resistors 88 and 90. The emitter 92 of transistor 76 is connected to the positive terminal of a direct current source 94 through the internal resistance 96 of the source. The emitter 98 of transistor 78 is connected to a load resistor 100 which in turn is connected through ground to the negative terminal of D.C. source 94. It should be understood that the polarity of the source 94 may be reversed and that if this were done the signal current would be reversed. A chopping control signal is generated by an alternating current source 102 and is connected through isolating transformer 104 between the collectors and bases of transistors 76 and 78 as shown. A.C. control source 102 cuts-off transistors 76 and 78 during one-half cycle and biases them into conduction during the next-half cycle to produce a chopped or modulated output signal at output terminal 106. An amplifier 108 may be connected as shown in dashed lines to output terminal 106 to form a modulated-carrier-wave amplifier.

Although this chopping circuit arrangement presents an improvement over those existing previously, it still has the above-mentioned disadvantages of the usual matched-transistor compensating circuit; that is, it increases the number of thermocouple junctions in the circuit, does not fully eliminate thermally-created error voltages, does not minimize the control current-generated voltage drops from the signal current path, and is expensive.

Another disadvantage of this circuit is that the maximum inverse or shut-off voltage that its transistors can withstand usually is limited by the base-emitter breakdown voltages of the individual transistors. In order to obtain break-down voltage ratings above a few volts, silicon alloy-type transistors have been most widely used. Since silicon alloy transistors are relatively low-frequency devices, the maximum switching frequency of such transistors and, hence, of transistor switching or chopping circuits using them, is usually around 100 kc. (one hundred thousand cycles per second). Although this speed is much higher than mechanical multivibrators, switching speeds substantially higher than this often are required. The semiconductor element of the present invention can be operated at frequencies approximately ten times greater than frequencies previously obtainable; i.e., frequencies of the order of one megacycle (one million cycles per second). Thus, the present invention helps meet the presently existing need for semiconductor devices having extremely high switching frequencies.

Figure 6:
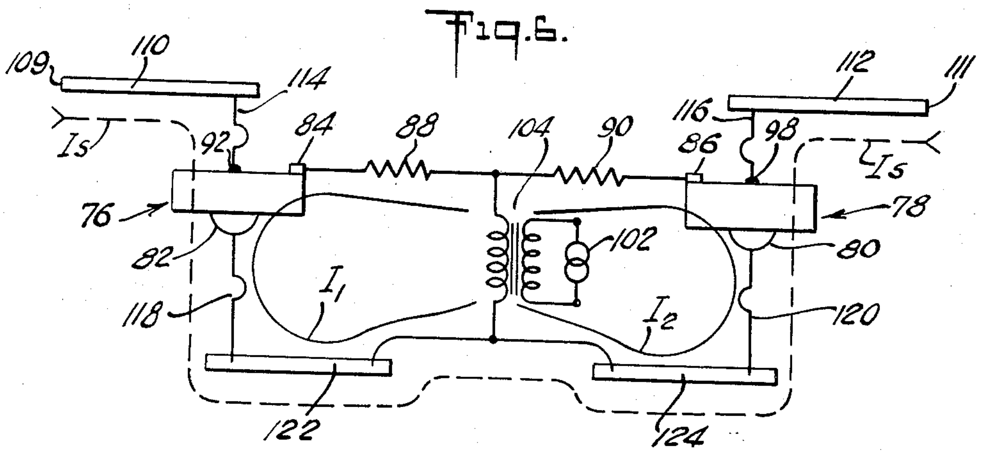
FIGURE 6 is a diagrammatic and schematic representation of the wiring connections and approximate path of the current flow through a portion of the circuit shown in FIGURE 5.

FIGURE 6 shows a portion of the matched transistor chopper circuit of FIGURE 5. FIGURE 6 shows the relatively large number of thermocouple junctions existing in the signal-current path in that arrangement and also indicates the approximate control-current and signal-current paths. The approximate path of the signal current is indicated by dashed line $I_s$ and the approximate paths of the control currents are indicated by solid lines $I_1$ and $I_2$.

Thermocouple junctions exist in the signal current path at point 109, the input terminal of emitter connection pin 110, and at point 111, the output terminal of emitter connection pin 112. Thermocouple junctions also exist at the respective connections between emitter pins 110 and 112 and emitter whisker wires 114 and 116; between lead wires 114 and 116 and emitters 92 and 98; between collectors 82 and 80 and collector lead wires 118 and 120; between collector lead wires 118 and 120 and collector pins 122 and 124; and at the junction (or junctions) of collector pins 122 and 124 with the external circuit.

Figure 7:
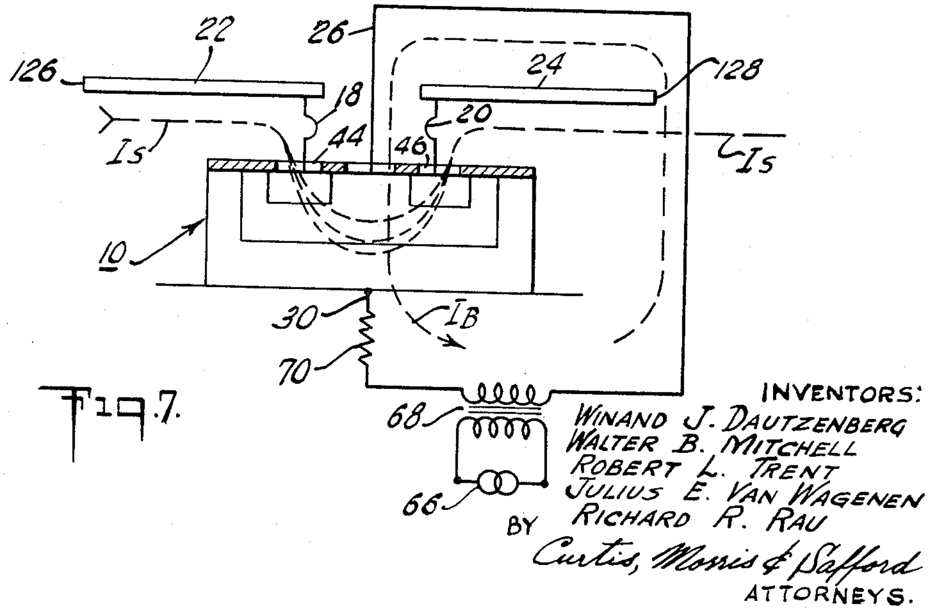
FIGURE 7 is a diagrammatic and schematic representation of the wiring connections and approximate path of current flow through a semiconductor element of the present invention used in the circuit shown in FIGURE 4.

By reference to FIGURE 7, it can be seen that the number of thermocouple junctions existing in the signal current path through the semiconductor device 10 used in FIGURE 4 and constructed in accordance with the present invention is substantially less than the number appearing in the circuit shown in FIGURE 6. FIGURE 7, which is similar to FIGURE 6, shows schematically and diagrammatically a portion of the circuit shown in FIGURE 4. The approximate path of the signal current through semiconductor element 10 is indicated by dashed line $I_s$ whereas the approximate path of the control current is indicated by dashed line $I_b$.

In the arrangement shown in FIGURE 7, thermocouple junctions exist in the signal current path at the input terminal 126 of pin 22 and also at the output terminal 128 of pin 24. In addition, thermocouple junctions exist only at the connection between pins 22 and 24 and lead wires 18 and 20 and at the junction between lead wires 18 and 20 and contacts 44 and 46.

By comparing the number of thermocouple junctions appearing in the signal path of the arrangement in FIGURE 7 with the corresponding number in FIGURE 6, it is seen that semiconductor circuit elements of the present invention permit the use of circuit connections which include substantially fewer thermocouple junctions in the signal path. As explained above, this gives the advantage that the circuit so constructed is less sensitive to ambient temperature and signal current variations.

Again referring to FIGURE 6, it is seen that in the usual matched-pair chopper circuit the control currents $I_1$ and $I_2$ flow in the same path as the signal current in a substantial portion of the circuit. Referring now to the illustration of element 10 in FIGURE 7, by way of comparison, the control current $I_b$ flows in a direction substantially perpendicular to the signal-current path in semiconductor element 10 and at no time flows through any connecting leads in which a signal current also flows. Thus, the arrangement shown in FIGURE 7 causes the control current and signal current to flow in separate paths so that the error-voltage drops will not be generated by the control current either in the semiconductor element 10 or at any circuit junctions in the signal path.

A problem that occurs in using the matched transistor chopper arrangement shown in FIGURE 5 is that undesired transient voltages are generated in the output signal when the transistors are switched off. It is believed that this is due to the relatively high capacitance existing at the base-emitter junction of each of the transistors. This problem exists primarily because, as described above, alloy transistors usually are used in such an arrangement, and because these alloy transistors have relatively high base-emitter capacitances.

The shut-off transient voltages developed by circuits using semiconductor elements in accordance with the present invention is substantially smaller than in devices using alloy transistors. This is because this device has lower junction capacitances in the signal current path, these lower capacitances resulting from the smaller junction areas attainable with diffusion techniques.

Another advantage of the chopping circuit shown in FIGURE 4 is that since the control current does not flow in the signal-current path an alternating-current control source need not have an accurately controlled square voltage wave shape. In fact, it is often possible to use a simple sine-wave voltage source for controlling the switching of element 10.

Figure 8:
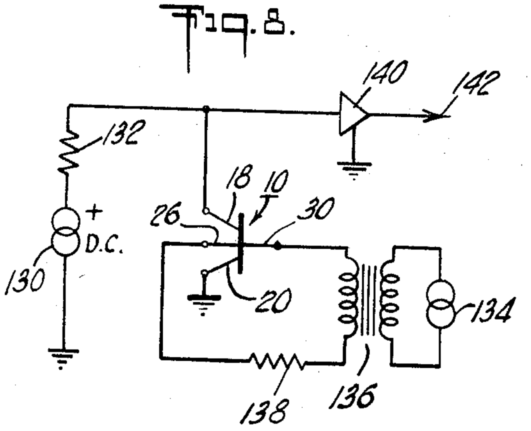
FIGURE 8 is a schematic circuit diagram of a shunt-type modulated-carrier-wave amplifier incorporating a semiconductor element constructed in accordance with the present invention.

In FIGURE 8 is shown a shunt-operated switching or chopping circuit utilizing a semiconductor element 10 constructed in accordance with the present invention. Signal terminal 18 of element 10 is connected to the positive terminal of a direct-current source 130 through the internal resistance 132 of the source. Signal terminal 20 of element 10 is connected through ground to the negative terminal of D.C. source 130. An alternating-current control signal is supplied by an A.C. source 134 through an isolating transformer 136 and a resistor 138 to the control terminals 26 and 30 of element 10. As element 10 is switched alternately on and off by control source 134, the output of D.C. source 130 is alternately short-circuited to ground through element 10 and then, when the element is not conducting, is presented as an output signal. An amplifier 140, which is connected to terminal 18 of element 10, amplifies the chopped output signal it receives and produces at output terminal 142 an amplified modulated-carrier-wave.

Figure 9:
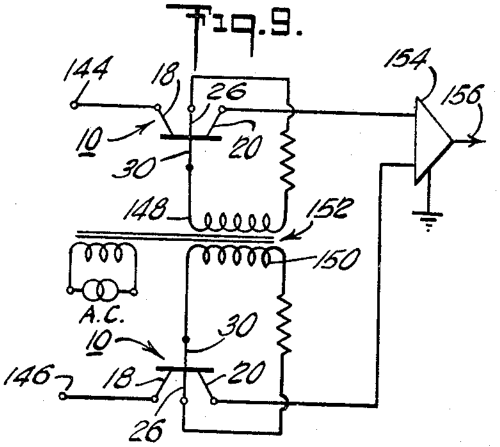
FIGURE 9 is a schematic circuit diagram of a high-frequency switching or chopping circuit adapted to produce a signal proportional to the difference between two input signals by use of a pair of semiconductor elements constructed in accordance with the present invention.

FIGURE 9 shows a differential series switching or chopping circuit utilizing two semiconductor elements 10 constructed in accordance with the present invention. In this arrangement a voltage signal is applied to input termial 144 and a second voltage signal is applied to terminal 146. Both semiconductor elements 10 are switched on simultaneously by separate secondary windings 148 and 150 of alternating-current supply transformer 152. The signals supplied to terminals 144 and 146 are therefore conducted during alternate half-cycles of the control voltage into a grounded differential amplifier 154 which gives an output at terminal 156 which is a function of the difference between the two input signals.

FIGURE 10 shows a phase-detector circuit incorporating a semiconductor element 10 constructed in accordance with the present invention. This circuit gives an output at terminal 158 that is proportional to both the amplitude of the alternating input-voltage source 160 and the phase angle difference between the voltage produced by source 160 and that produced by A.C. reference source 162. Signal terminal 18 is connected through secondary winding 164 of a transformer 166 whose primary winding 168 is supplied by A.C. source 160. Terminal 20 of element 10 is connected to resistance-capacitance circuit 170 and thence to output terminal 158. Reference voltage source 162 is connected through isolating transformer 172 and resistor 174 to control terminals 26 and 30 of element 10.

The circuit shown in FIGURE 11 is a circuit for producing a modulated radio-frequency signal. In this circuit an audio-frequency alternating-current modulating wave is connected to input terminal 176 through input capacitor 178 and grounded resistor 180 to signal terminal 18 of semiconductor device 10. A radio-frequency alternating-current carrier wave source 182 is connected through isolating transformer 184 and resistor 186 to control terminals 26 and 30. Signal terminal 20 is connected to output terminal 190 through a "high-pass" filter 188 which filters out audio-frequency components from the output wave.

The above description of the invention is intended to be illustrative and not in limitation thereof. Various changes or modifications in the embodiments described may occur to those skilled in the art and these can be made without departing from the spirit or scope of the invention.

What is claimed is:

1. An electrical switching device made of semiconductor material, said device consisting of: a first region, a second region and a third region of a material of one conductivity type, said first and second regions being separated from said third region by an intervening region of a material of another conductivity type; electrically conductive electrode means on said first, second, third and intervening regions; bias circuit means connected to said electrodes on said first and second regions for conducting an input signal through said device in a first path; control bias circuit means connected to said electrodes on said intervening region and on said third region for conducting a control signal through said element in a second path extending through said device, said second path being, at substantially all points along its length, transverse to said first path.

2. Apparatus as in claim 1 in which said first and second regions are substantially identical to one another in distribution of impurities and in physical dimensions.

3. Apparatus as in claim 2 in which all of said regions are located in a single wafer of semiconductor material having at least one major face of planar configuration, the major junction surfaces of said regions being substantially planar and parallel to said major face, and including a planar epitaxial layer on said third region, said layer being of the same conductivity type as said third region but having a relatively lower resistivity than said third region.

4. A semiconductor switch comprising a semiconductor body including first and second regions of opposite conductivity type separated by a p-n junction, a first ohmic contact on said first region, a second ohmic contact on said second region, said first and second contacts are separated by the combined thickness of said first and second region and said p-n junction and are substantially coaxial, first and second zones located in said second region and each being of opposite conductivity type to that of said second region, discrete ohmic contacts on said first and second zones, respectively, first biasing means connected to said discrete ohmic contacts and applying an input signal thereto to create a first current path within said second region between said discrete ohmic contacts, and second biasing means connected across said first and second ohmic contacts to create a second current path across said p-n junction between said first and second ohmic contacts to intersect substantially at right angles said first current path to switch the impedance of said first current path between high and low impedance states by changing the bias across said p-n junction.

5. A semiconductor switch as set forth in claim 4 wherein said first and second zones are on opposite sides of said second ohmic contact and spaced substantially the same distance therefrom.

6. A dual-emitter transistor switching device comprising, in combination: a single-crystal semiconductor wafer with a planar surface, a first region of one conductivity type in said wafer, said first region comprising a common collector for said device, a second region of another conductivity type in said wafer, said second region forming a p-n junction with said first region and comprising a common base for said device, third and fourth regions of said one conductivity type in said second region, said third and fourth regions forming dual emitters for said device, being located closely adjacent one another and said planar surface, and formnig p-n junctions with said second region, with at least the portions of the latter p-n junctions which are closest to one another terminating at said planar surface of said wafer, the distances separating said latter p-n junctions on said planar surface being substantially symmetrical with respect to a centerline between said latter p-n junctions on said surface, said third and fourth regions being substantially identical in impurity concentration and physical dimensions, the minimum distances between said first region and each of said third and fourth regions being substantially equal, a first ohmic contact on said first region, a second ohmic contact on said second region, said second ohmic contact being located on said planar surface substantially symmetrically with respect to said centerline, third and fourth ohmic contacts on said third and fourth regions, respectively, said third and fourth contacts being shaped and positioned on said surface symmetrically with respect to said centerline.

7. Apparatus as in claim 6 including a conductor bonded to said second ohmic contact at a position spaced from the location of the smallest distance on said surface between said third and fourth regions.

8. Apparatus as in claim 7 in which said second ohmic contact has an enlarged area at said position, said enlarged area being shaped symmetrically with respect to said centerline.

9. Apparatus as in claim 6 in which said second ohmic contact substantially encloses said third and fourth regions.

10. Apparatus as in claim 9 in which said second ohmic contact includes a portion positioned on said surface between said third and fourth regions.

11. Apparatus as in claim 9 in which said second ohmic contact is substantially equidistant from said third and fourth contacts.

References Cited

UNITED STATES PATENTS

| | | | |
|---|---|---|---|
| 2,985,804 | 5/1961 | Buie | 317—235 |
| 3,046,405 | 7/1962 | Emeis | 250—211 |
| 3,103,599 | 9/1963 | Henkels | 307—88.5 |
| 3,111,590 | 11/1963 | Noyce | 307—88.5 |
| 3,230,398 | 1/1966 | Evans | 307—88.5 |
| 3,237,018 | 1/1966 | Leger | 307—88.5 |
| 3,241,013 | 3/1966 | Evans | 317—235 |

FOREIGN PATENTS

| | | |
|---|---|---|
| 199,909 | 3/1958 | Austria. |
| 1,257,419 | 2/1961 | France. |

JOHN W. HUCKERT, *Primary Examiner.*

M. H. EDLOW, *Assistant Examiner.*